United States Patent [19]

Maguire et al.

[11] 4,347,210

[45] Aug. 31, 1982

[54] METHOD OF FORGING SPINEL DOMES

[75] Inventors: Edward A. Maguire, Ashland; Richard L. Gentilman, Acton, both of Mass.

[73] Assignee: Raytheon Company, Lexington, Mass.

[21] Appl. No.: 148,427

[22] Filed: May 9, 1980

[51] Int. Cl.³ .............................................. B29D 11/00
[52] U.S. Cl. .................... 264/294; 264/1.2; 264/2.7; 264/320; 264/325
[58] Field of Search ................. 264/1.2, 2.7, 325, 320, 264/294

[56] References Cited

U.S. PATENT DOCUMENTS

| | | | |
|---|---|---|---|
| 2,219,423 | 10/1940 | Kurtz | 75/22 |
| 3,026,210 | 3/1962 | Coble | 264/1.2 |
| 3,431,326 | 3/1969 | Letter | 264/1.2 |
| 3,864,808 | 2/1975 | Doser | 29/420.5 |
| 3,875,277 | 4/1975 | Bratton et al. | 264/1.2 |
| 3,933,970 | 1/1976 | Rosette et al. | 264/1.2 |
| 4,171,400 | 10/1979 | Rosette et al. | 264/1.2 |

OTHER PUBLICATIONS

Rhodes et al., "Hot-Working of Aluminum Oxide: II, Optical Properties", Journal of the Am. Ceramic Soc., vol. 58, No. 1-2, Feb. 75, pp. 31-34.

Becher, "Press-Forged $Al_2O_3$-Rich Spinel Crystals for IR Applications", Am. Ceramic Soc. Bull., vol. 56, No. 11, (1977) pp. 1015-1017.

Primary Examiner—James H. Derrington
Attorney, Agent, or Firm—V. D. Pitruzzella; Milton D. Bartlett; Joseph D. Pannone

[57] ABSTRACT

A method of forging spinel into complex shapes in which a spinel plate is placed in a mold while the spinel plate is heated, in an atmosphere of helium, to a temperature below its melting point and above its solid two phases transition point that allows plastic deformation to take place. Forging stresses well above the yield point of the spinel are applied to the plate by the mold to reduce the forging time.

15 Claims, 4 Drawing Figures

METHOD OF FORGING SPINEL DOMES

"Government has rights in this invention pursuant to Contract No. N00014-76-C-0635 awarded by the Department of the Navy.

BACKGROUND OF THE INVENTION

There is a need to produce high durability transparent windows and IR domes for airborne applications. These components must be resistant to thermal shock induced by aerodynamic heating and also to the long term effects of rain and solid particle erosion. A common material currently used in such applications is magnesium flouride, $MgF_2$. Since it is too easily eroded and it does not adequately withstand temperature differentials, new optical materials made by cost effective fabrication processes are needed. Magnesium aluminate spinel is a possible replacement for magnesium flouride since spinel has a greater hardness that also results in greater erosion resistance. Production problems arise from the greater hardness of spinel since it is very difficult to machine, thus, producing a complex shape of spinel is both hard and expensive. Forging spinel crystals into complex shapes has not been heretofore possible. A technical note appearing in American Ceramic Society Bulletin, Vol. 56, No. 1 (1977) P. 1015–1017 entitled "*Press Forged $Al_2O_3$-Rich Spinel Crystals for IR Application*" by Paul F. Becker, describes a process whereby a single crystal spinel disk is deformed by slow compressive forces at high temperature into a thinner disk and achieves approximately 60% height reduction. This process is limited to simple planar shapes deformed by compressive stresses and resulting in a forged disk that has a certain number of precipitates which detract from the optical transmittance of the product.

SUMMARY OF THE INVENTION

The foregoing problems and limitations are overcome and other advantages are provided by the present method which allows both single and polycrystal spinels to be forged into optical transparent complex articles.

The invention discloses that complex shapes in spinel articles can be achieved by a hot forging process in which tensile as well as compressive stresses are used to plastically deform the normally brittle spinel. The invention provides for placing a spinel plate between the two portions of a mold defining a cavity of a predetermined complex shape, heating the spinel plate to a temperature range which results in articles substantially free of inhomogeneities, and applying a pressure to the mold for plastically deforming the spinel plate to the shape of the mold cavity. More specifically, the temperature range is bounded in the upper limit by the melting point of the spinel used and in the lower limit by the transition point separating the solid single phase from the solid two phase mixture of the spinel used. Pressure is applied to the mold for producing maximum stresses in the spinel greater than its yield stress and lower than its fracture stress. Operation at a temperature higher than the lower limit is preferred, in order to exceed the brittle-ductile transition temperature of the composition used and because it is found to improve optical transparency by avoiding the formation of precipitates occurring at or below the transition point. However, melting of the spinel must be avoided in order to eliminate the problems of random recrystallization occurring on cool down. Preferably, the forging temperature is in the range of 1750° to 1850° C., the actual temperature also being a function of the proportion of aluminum oxide in the spinel.

In the embodiment shown a mold having a hemispherical cavity is used for producing spinel domes. The operating ranges of temperature and stress of the present invention, however, may be used with molds having cavities of different shapes. The forging method of the present invention allows the normally hard and brittle spinel to be plastically deformed by a combination of tensile and compressive stresses to form transparent articles of complex shape without any cracking or weakening. Additionally, the shape process can be applied to other compounds having similar characteristics and a phase transition point at which the compound changes its phase state, since the present invention discloses forging such compound at a temperature that allows the compound to remain in its starting phase to prevent formation of undesirable mixtures.

BRIEF DESCRIPTION OF THE DRAWINGS

A better understanding of the features of the preferred embodiment may be obtained from the accompanying detailed description used in conjunction with the drawings in which.

DESCRIPTION OF THE PREFERRED EMBODIMENT

Figure 1A:
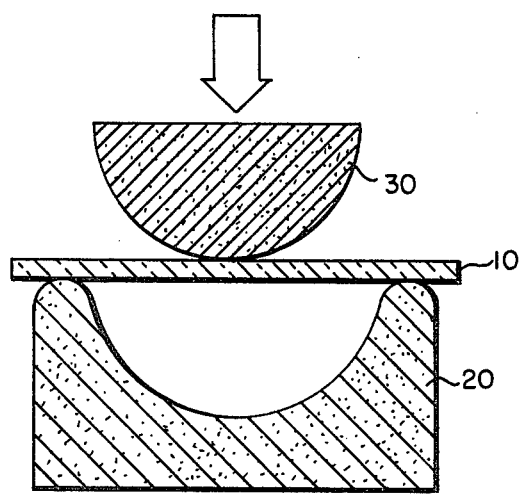
FIGS. 1A–1C are three cross-sectional views depicting the start, intermediate and end positions of the mold in the hot forging of a spinel disc into a hemispherical dome shape.
Figure 1B:
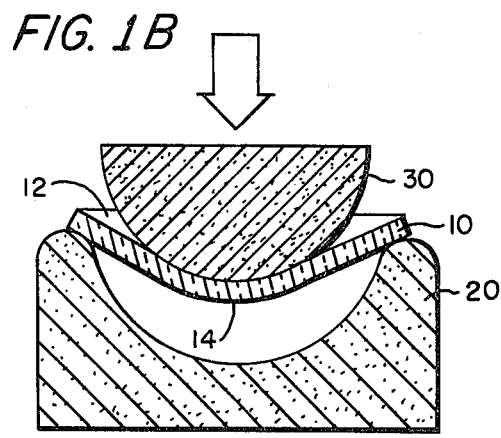
Figure 1C:
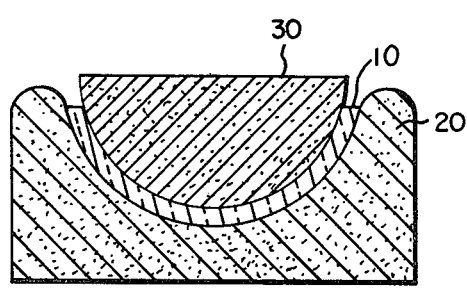

Referring now to FIGS. 1A through 1C, there is shown one embodiment of the present invention for forging spinel domes. A flat plate of spinel material 10 having the required thickness is positioned over a lower portion 20 of the mold.

Spinel plate 10 is a non-stoichiometric alumina rich spinel, the ratio of alumina, $Al_2O_3$, to magnesium oxide, MgO, being greater than 1. A block of spinel can be further characterized as single crystal, having a uniform crystalline structure throughout the block, or as polycrystalline, having several separate single crystal regions within the block. The structure of a particular spinel depends on the method by which it is fabricated. Transparent single crystal spinels can be fabricated by known methods such as flame fusion and Czochralski growing. Conventional methods of fabricating polycrystalline spinel include sintering and hot forming. Powder processing of this type results in a spinel of limited optical quality, having a transmittance limited in its maximum level and in its wavelength range. Since the forging method described hereinbelow applies to either single crystal of polycrystalline alumina rich spinel, a method was also found for fabricating polycrystalline spinel with transmission characteristics similar to single crystal panel. High purity aluminum oxide and magnesium oxide powders are mixed in predetermined molar ratios of alumina to magnesium oxide. The ratios can be in the range from slightly above 1 to 3.5. The ratio of exactly 1 results in stoichiometric spinel which was not used in the forging operation since it requires much higher stresses to plastically deform.

More typically, a ratio of 2 was used. The powders are dry blended for about 4 hours and then isostatically compressed at approximately 5,000 to 10,000 psi to form the starting charge. The mixed oxide charge is placed in a molybdenum crucible above a mold of appropriate shape and is placed in a high temperature furnace for melting. When the oxide is fully molten in the upper crucible, it flows downward into the mold through a preexisting drain hole. The melt is held at temperature for about two hours. The furnace temperature is then decreased and a temperature gradient is created across the mold to directionally crystallize the spinel.

Referring back to FIG. 1, spinel plate 10 can either be a single crystal or polycrystalline spinel fabricated by known techniques or with a method described hereinabove. Mold 20 has a cavity having a hemispherical shape whose contour is used to produce the desired dome shape. The top portion 30 of the mold is positioned over spinel plate 10 using an alignment fixture not shown. Top portion 30 has also a hemispherical shape made to match the cavity of lower portion 20. The assembly is then placed in a furnace where the temperature is raised to a level past the brittle-ductile transition point of the spinel, thus making the spinel plate 10 ductile. Due to the high temperatures needed for the forging operation, the mold, the fixture and all the elements needed to provide the predetermined pressure to the mold are made of graphite and are of conventional design. Care must be used to keep the temperature below the melting point of the spinel composition used, otherwise improper recrystallization will take place on cool down. It was found that when alumina rich spinel is hot forged, the forgings often contained inhomogeneities. It was further found that for a particular spinel composition this inhomogeneity formation is dependent on the temperature of the forging process. These inhomogeneities are a precipitate which is formed at a temperature in which the composition of spinel goes from a solid single phase to a solid two phase state resulting in a mixture of corundum and spinel. The corundum is formed by some of the aluminum oxide normally present in the spinel. Single crystal and polycrystalline spinel is optically isotropic due to its cubic crystalline structure and thus is well suited for IR dome applications. The aluminum oxide precipitate does not have a cubic structure, and it forms small regions having index of refraction different than spinel. Thus, the presence of corundum precipitates act as light scattering centers, thereby reducing the transmittance of the IR dome, and it is desirable to limit or eliminate the amount of precipitate.

Figure 2:
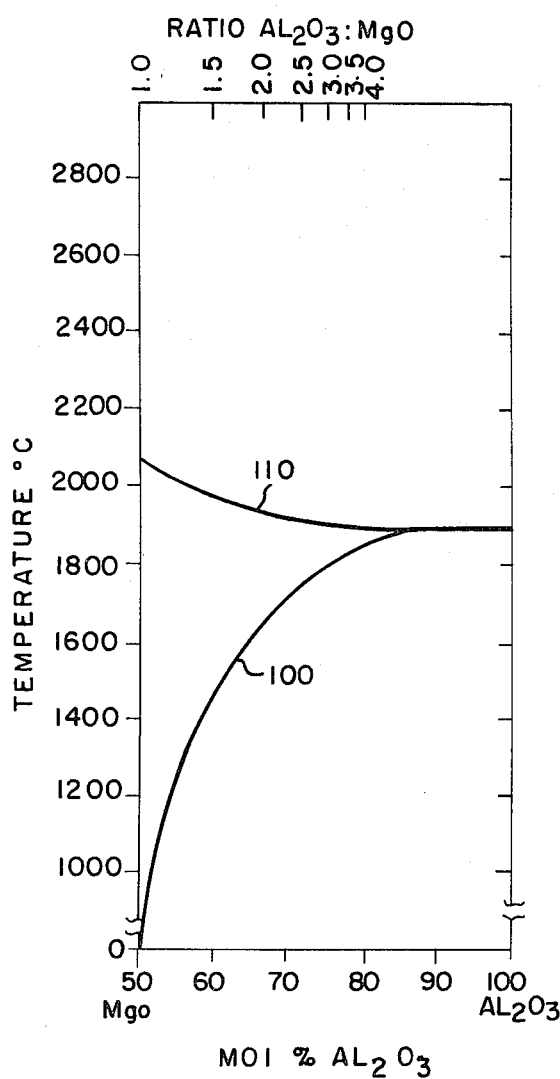
FIG. 2 is a phase diagram for the $MgO-Al_2O_3$ system, showing the liquid-solid single phase and single phase-two phases transition lines for different ratios of the materials.

FIG. 2 is a phase diagram for spinel showing the relationship between different compositions of spinel, temperature and phase state of the spinel. Line 100 represents the transition between two different phases of the $MgO-Al_2O_3$ system, the area to the left of line 100 represents the temperature range at which different compositions of spinel will be in the solid single phase, while the area to the right of line 100 shows the temperatures at which the spinel compositions are in the solid two phase state forming a mixture of corundum and spinel. Operation in the two phase region must be avoided if corundum precipitate is to be completely avoided. If small amounts of corundum can be tolerated, the amount of time that the process spends in the two phases region must be limited, since the phase change occurs over a period of time. The forging time can be decreased for a given temperature by increasing the amount of stress produced in the spinel plate 10 by the mold.

Additionally the temperature used must exceed the brittle-ductile transition temperature of the composition used to enable the plate to be plastically deformed. The forging temperatures used for spinel far exceed those used for metals, since most forged metals have brittle-ductile transition temperature well below those of ceramic compounds such as spinel and the forging temperature range disclosed here is higher than the melting point of most commonly used forged metals. Line 110 in FIG. 2 shows the temperatures at which the spinel starts to liquefy. As mentioned hereinabove, even partial melting of the spinel leads to severe problems. As the temperature drops, the spinel will start crystallizing in different points. Since the liquid to solid transition results in a decrease in volume, voids are created within the spinel which lead to cracks in the forgings. It was found desirable to operate well below the melting point, since the pressure of the forging process might cause localized temperature increases which lead to localized melting. Additionally, it might be difficult to uniformly control the temperature of the spinel plate 10, thus, to avoid creating hot spots in the spinel the stabilized operating temperature should include a reasonable margin of safety to prevent any possible local melting. Phase transition curves 100 and 110 of FIG. 2 are obtained from the following reference, G. A. Rankin and H. E. Merwin, "The Ternary System, $CaO-Al_2O_3-M_gO$", Journal of the Amer. Chem. Soc. 38 [3]568-588 (1916).

Once the spinel plate 10 in the furnace has reached its final temperature and has been stabilized, the top portion 30 of the mold applies an initial pressure by conventional means not shown, to provide a bending stress at the center of plate 10 that exceeds the yield point of the spinel plate. The top surface 12 of plate 10 is then under compressive stress while the bottom surface 14 of plate 10 is under tensile stress. As top portion 30 of the mold travels downward towards the bottom portion 20 of the mold flat plate 10 deforms plastically and starts to develop the shape of top portion 30 of the mold. The linear motion is monitored so that the pressure applied to the mold can be adjusted to provide the required stress to the plate 10. The pressure may be adjusted to provide substantially uniform stresses on plate 10. As top portion 30 reaches its final position, it is seen from FIG. 1C that spinel plate 10 has been plastically deformed to its final shape. The stress applied to spinel plate 10 by top portion 30 of the mold must be greater than the stress necessary to plastically deform the spinel material. Higher stresses will result in a faster deformation. This leads to an additional advantage in that the shorter time spent at temperatures of the forging process results in the forming of fewer precipitates for cases where the forging temperature is at the transition point temperature. However, the maximum stress developed must not exceed the fracture point of the spinel composition used. Additionally, the forging takes place in an inert environment, preferably in a furnace using an atmosphere of helium, in order to further eliminate contamination of the spinel material.

Spinel plates approximately 2.75 cm in diameter and 0.20 cm thick have been forged, using the present invention, into domes having a radius of curvature of approximately 1.2 cm. As an example, to further illustrate the invention, a polycrystalline spinel plate fabricated according to the method described hereinabove and having a 2 to 1 ratio of alumina to magnesium oxide was hot forged in a furnace at a temperature of 1750° C. As can be seen from the phase diagram of FIG. 2 for a spinel having a ratio of 2, the temperature is well above the transition point and is substantially less than the melting point of the spinel of this composition. This temperature was chosen higher than the minimum required to avoid the transition point because ductility of the spinel increases with temperature. The advantageous result of this is that a lower pressure could be used at higher temperatures to produce plastic deformation without substantially increasing the forging time. In this case, a stress of 15 ksi was developed and resulted in a spinel dome that was substantially free of inhomogeneities. As another example, a commercially available single crystal spinel having a ratio of approximately 3 to 1 for aluminum oxide to magnesium oxide was hot forged in a furnace at a temperature of 1850° C. The higher temperature required for this is due to the fact that for such a spinel composition, the transition point occurs at a higher temperature. Using the higher temperature results in a more ductile spinel thus allowing the use of smaller stresses. This spinel composition was found to be more ductile for a second reason, since it was found that a given temperature, the ductility of spinel increases for compositions employing a greater proportion of aluminum oxide. A stress of 7.5 ksi was used to plastically deform the spinel plate to its final shape.

It is understood that the above described embodiments of the invention are illustrative only and that modifications thereof may occur to those skilled in the art. For instance, even though only a dome shape mold is shown it can easily be seen that other complex shapes can be used in the mold to forge more complex articles. Additionally, it can be seen that even though only alumina rich spinel has been described as the starting composition, other materials, such as spinel crystals or ceramic compositions, having similar characteristics can be employed as a starting material in this forging method. Accordingly, it is desired that this invention is not to be limited to the embodiments disclosed herein but is to be limited only as defined by the appended claims.

What is claimed is:
1. A method of comprising the steps of:
placing a plate of spinel between two portion of a mold, said two portions having complementary shapes for forming a cavity of a predetermined complex shape;
the composition of said spinel comprising a ratio of $Al_2O_3$:MgO in the range of greater than 1:1 to 3.5:1;
heating said spinel to a temperature in the range below its melting point and above its single phase transition point; and
applying a pressure to said mold for producing compound stresses in said spinel plate to plastically deform said spinel plate to the complex shape of the mold cavity.
2. The method of claim 1 wherein said temperature is in the range of 1750° to 1850° C.
3. A method comprising the steps of:
forming an alumina-rich plate having a ratio of $Al_2O_3$:MgO in the range of greater than 1:1 to 3.5:1;
placing said spinel plate over a lower portion of a mold having a cavity of a predetermined shape;
placing a top portion of said mold over said spinel plate in mating relationship with said lower portion and preventing said top portion from applying significant pressure;
heating said spinel plate to a forging temperature below its melting point at which plastic deformation of said spinel plate can take place;
said forging temperature having a value higher than the phase transition point of said spinel for substantially preventing a change in said spinel from a single phase to a two-phase state;
applying a pressure to said mold exceeding the yield stress in at least one portion of said spinel plate but not reaching the fracturing point of spinel; and
said pressure and said mold shape producing compound stresses in said spinel plate.
4. The method of claim 3 wherein forming said alumina-rich spinel plate further comprises:
combining and dry blending predetermined amounts of aluminum oxide and magnesium oxide until thoroughly mixed;
compressing said mixture to form a starting charge;
heating said starting charge in a mold of predetermined shape until thoroughly molten; and
creating a temperature gradient across the mold for providing directional cooling.
5. The method of claim 3 wherein said forging temperature is in the range of 1750° to 1850° C.
6. The method of claim 3 wherein the value of said forging temperature is a function of said $Al_2O_3$ to MgO ratio.
7. The method of hot forging a plate of alumina-rich spinel, having a ratio of $Al_2O_3$:MgO in the range of slightly over 1:1 to 3.5:1, into a complex shape comprising the steps of:
placing said plate over a first portion of a mold, said first portion having a cavity therein substantially defining a first complex surface;
placing a second portion of said mold over said spinel plate without causing said second portion to exert significant pressure on said plate, said second mold portion having a second complex surface and being capable of mating with said first mold portion;
heating said spinel plate to a forging temperature below its melting point and within the temperature range in which said spinel can exist in its solid angle phase and at which plastic deformation can readily take place; and
applying pressure to said mold for producing compound stresses in portions of said spinel plate that cause said spinel plate to conform to the first and second complex surfaces of said mold, said forging temperature and stresses having values producing a minimum temperature in said spinel plate higher than the transition point of said spinel for substantially keeping said spinel in its single phase state.
8. The method of claim 7 wherein said forging temperature is in the range of 1750° to 1850° C.
9. The method of claim 8 wherein the forging temperature used is a function of said ratio in said spinel.
10. The method of claim 4 wherein said stresses in said spinel are bending stresses and include tensile stresses.
11. The method of claim 10 wherein said mold pressure produces maximum stresses in said spinel exceeding the yield stress but not exceeding the fracture stress of said spinel.
12. The method of claim 11 wherein said stresses are in the range of 7.5 to 15 ksi.
13. The method of claim 1 wherein:
said temperature is selected as a function of the composition of said spinel.
14. The method of claim 1 wherein:
said spinel plate comprises polycrystalline spinel.
15. The method of claim 1 wherein:
said spinel plate comprises single crystal spinel.

* * * * *